United States Patent
Nakada (10) Patent No.: US 6,301,088 B1
(45) Date of Patent: Oct. 9, 2001

(54) MAGNETORESISTANCE EFFECT DEVICE AND METHOD OF FORMING THE SAME AS WELL AS MAGNETORESISTANCE EFFECT SENSOR AND MAGNETIC RECORDING SYSTEM

(75) Inventor: Masafumi Nakada, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/289,190

(22) Filed: Apr. 9, 1999

(30) Foreign Application Priority Data

Apr. 9, 1998 (JP) .................................. 10-097323

(51) Int. Cl.$^7$ .................................................. G11B 5/127
(52) U.S. Cl. ......................................................... 360/324.11
(58) Field of Search ........................... 360/315, 324.11, 360/324, 320, 324.12, 324.1, 323, 322, 314, 327.32, 327.3, 325

(56) References Cited

U.S. PATENT DOCUMENTS

| | | |
|---|---|---|
| 4,809,109 | 2/1989 | Howard et al. . |
| 4,949,039 | 8/1990 | Grunberg ............................. 324/252 |
| 5,206,590 | 4/1993 | Dieny et al. ......................... 324/252 |
| 5,301,079 | 4/1994 | Cain et al. ....................... 360/324.11 |
| 5,465,185 * | 11/1995 | Heim et al. ..................... 360/324.11 |
| 5,574,605 * | 11/1996 | Baumgart et al. ............. 360/324.11 |
| 5,583,725 * | 12/1996 | Coffey et al. ................... 360/324.11 |
| 5,701,223 * | 12/1997 | Fontana, Jr. et al. ........... 360/324.11 |
| 5,742,458 * | 4/1998 | Koike et al. .................... 360/324.11 |
| 5,828,529 * | 10/1998 | Gill ................................. 360/324.11 |
| 5,862,021 * | 1/1999 | Deguchi et al. ................ 360/324.11 |
| 5,867,351 * | 2/1999 | Gill ................................. 360/324.11 |
| 5,898,549 * | 4/1999 | Gill ................................. 360/324.11 |
| 5,917,400 | 6/1999 | Fujikata et al. ........................ 338/32 |
| 5,972,420 | 10/1999 | Saito et al. ............................ 427/130 |
| 6,038,107 * | 3/2000 | Pinarbasi ........................ 360/324.11 |
| 6,063,491 | 5/2000 | Fujikata et al. ...................... 428/332 |
| 6,112,402 | 9/2000 | Saito et al. ........................ 29/603.13 |
| 6,198,378 | 3/2001 | Saito et al. ............................ 338/32 |

FOREIGN PATENT DOCUMENTS

| | | |
|---|---|---|
| 1-248578 | 10/1989 | (JP) . |
| 2-61572 | 3/1990 | (JP) . |
| 4-358310 | 12/1992 | (JP) . |
| 6-111252 | 4/1994 | (JP) . |
| 6-203340 | 7/1994 | (JP) . |
| 8-204253 | 8/1996 | (JP) . |
| 9-73611 | 3/1997 | (JP) . |
| 9-237411 | 9/1997 | (JP) . |
| 9-251619 | 9/1997 | (JP) . |

OTHER PUBLICATIONS

IEEE Transactions on Magnetics, vol. Mag–11, No. 4 Jul. 1975—"Thin Film Magnetoresistors in Memory, Storage, and Related Applications", pp. 1039–1050.

* cited by examiner

Primary Examiner—Allen Cao
(74) Attorney, Agent, or Firm—Foley & Lardner (57) ABSTRACT

The present invention provides a multilayer structure comprising: one of a first antiferromagnetic layer and a bias ferromagnetic layer; an interface control layer in contact with the one of the first antiferromagnetic layer and the bias ferromagnetic layer; a free magnetic layer in contact with the interface control layer; a non-magnetic layer in contact with the free magnetic layer; a pinned magnetic layer in contact with the non-magnetic layer; and a second ferromagnetic layer in contact with the pinned magnetic layer.

14 Claims, 5 Drawing Sheets

MAGNETORESISTANCE EFFECT DEVICE AND METHOD OF FORMING THE SAME AS WELL AS MAGNETORESISTANCE EFFECT SENSOR AND MAGNETIC RECORDING SYSTEM

BACKGROUND OF THE INVENTION

The present invention relates to a magnetoresistance effect device having a spin value structure for utilizing a variation in electrical resistance caused by relationships in variation of both a magnetization direction of a pinned layer and a magnetization direction of a free layer effected by an externally applied magnetic field, and a method of forming the same as well as a magnetoresistance effect sensor and a magnetic recording system.

The magnetoresistance effect sensor or the magnetoresistance effect head are useful for reading data from a magnetic surface at a large linear density. The magnetoresistance effect sensor detects magnetic signals based upon variations in intensity and direction of a detected magnetic flux.

The conventional magnetoresistance effect sensor is operated based upon an anisotropic magnetoresistance effect where one component of a resistance of the reading device varies in proportional to squares of cosine of an angle between a magnetization direction and a defecting current direction flowing through the device. This anisotropic magnetoresistance effect is disclosed in detail in literature IEEE Trans. On Mag. MAG-11, p. 1039, 1975 "D. A. Thomson et al. Memory Storage and Related Application".

In recent years, remarkable magnetoresistance effects have been reported such as a giant magnetoresistance effect and a spin valve effect, wherein the variation in resistance of the magnetic sensor is caused by a spin dependent conductivity of conductive electrons between two magnetic layers sandwiching a non-magnetic intermediate layer and by a spin dependent scattering phenomenon on interfaces thereof.

Those magnetoresistance effect sensors utilizing the giant magnetoresistance effect or the spin valve effect show higher sensitivities or larger variations in resistance than the conventional sensors utilizing the anisotropic magnetoresistance effect. The giant magnetoresistance effect sensor or the spin valve effect sensor utilizes the phenomenon that in-plane resistances of the paired ferromagnetic layers sandwiching the non-magnetic layer vary in proportional to cosine of an angle between the magnetization directions of the paired ferromagnetic layers.

In Japanese laid-open patent publication No. 2-61572, it is disclosed that an antiparallel magnetization causes the big variation in magnetoresistance of the magnetic layered structure. Available materials for the magnetic layered structure are ferromagnetic transition metals and ferromagnetic alloys. Further, it is possible to add an antiferromagnetic layer on one of the paired ferromagnetic layers sandwiching the non-magnetic layer. FeMn is suitable for the antiferromagnetic layer.

In Japanese laid-open patent publication No. 4-358310, it is disclosed that no applied magnetic field to the two thin ferromagnetic layers sandwiching the non-magnetic layer causes that the magnetization directions of the two ferromagnetic layers are perpendicular to each other. A resistance between two non-coupled ferromagnetic layers varies in proportional to cosine of the angle of the magnetization directions of those two layers, so that the magnetoresistance effect sensor shows sensing operation independently from the direction of the current flowing through the sensor.

In Japanese laid-open patent publication No. 6-203340, it is disclosed that two thin ferromagnetic layers are provided which sandwich the non-magnetic thin film and if no external magnetic field is zero, a magnetization direction of an adjacent antiferromagnetic layer is kept in perpendicularly to a magnetization direction of other ferromagnetic layer.

In order to reduce a noise of the magnetoresistance effect sensor, it is important that the variation of the magnetization direction of the free layer due to an externally applied magnetic field is continuous without, however, any hysteresis, for which reason an effective external magnetic field is applied to the free magnetic layer to form a single magnetic domain.

In Japanese laid-open patent publication No. 9-73611, it is disclosed that an antiferromagnetic layer is positioned under a free magnetic layer so that the antiferromagnetic layer is securely contact with the free layer in opposite sides regions defined with predetermined track regions so as to order the magnetization directions of the free layer. In the free layer adhered with the antiferromagnetic layer, an exchange-coupling magnetic field is generated thereby fixing the magnetization direction of the free layer securely in contact with the antiferromagnetic layer. The fixed portion and the continuously varied portion of the free layer are also made into single magnetic domain.

Figure 1:
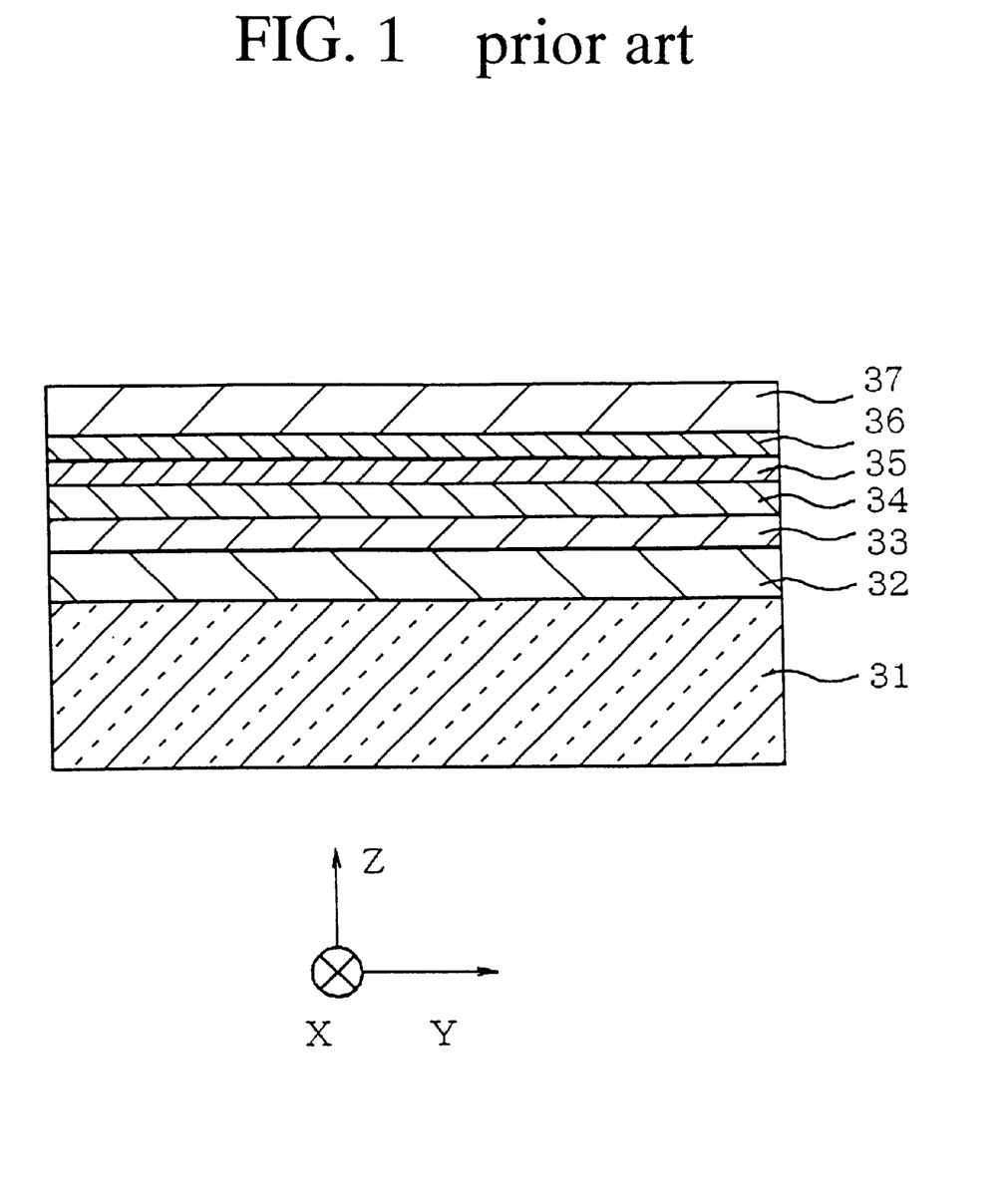
FIG. 1 is a fragmentary cross sectional elevation view illustrative of a lamination structure of a conventional magnetoresistance effect sensor.

FIG. 1 is a fragmentary cross sectional elevation view illustrative of a lamination structure of a conventional magnetoresistance effect sensor. An externally applied magnetic field to the magnetoresistance effect sensor is directed in an X-direction. This lamination structure is as follows. A bottom gap layer 32 is laminated on a substrate 31. A base layer 33 is laminated on the bottom gap layer 32. A free magnetic layer 34 is laminated on the base layer 33. A non-magnetic layer 35 is also laminated on the free magnetic layer 34. A pinned magnetic layer 36 is also laminated on the non-magnetic layer 35. An antiferromagnetic layer 37 is also laminated on the pinned magnetic layer 36.

For the magnetoresistance effect sensor utilizing the spin valve, it is necessary that the magnetization direction of the pinned layer is fixed by the antiferromagnetic layer. Generally, Fe—Mn, NiO, Ni—Mn, Pt—Mn alloys are available. FeMn and NiO are advantageous in easy formation but disadvantages in low thermal stability due to a low blocking temperature of 200° C.

The antiferromagnetic layer is made of an alloy such as Ni—Mn alloy which has a relatively high blocking temperature of not less than 200° C. whereby the antiferromagnetic layer has a high thermal stability. However, in order to cause the exchange-coupling magnetic field directed in a predetermined direction, it is necessary to carry out a heat treatment in the magnetic field. This heat treatment in the magnetic field provides an influence to the magnetic anisotropy of the free magnetic layer whereby a hysteresis appears on an R-H curve or an electric resistance-magnetic filed curve. As a result, noises are generated in the measurement of the magnetic field.

In the above circumstances, it had been required to develop a novel magnetoresistance effect sensor free from the above problems and a method of forming the same as well as a magnetic recording system.

SUMMARY OF THE INVENTION

Accordingly, it is an object of the present invention to provide a novel magnetoresistance effect sensor free from the above problems.

It is a further object of the present invention to provide a novel magnetoresistance effect sensor with a high thermal stability.

It is a still further object of the present invention to provide a novel magnetoresistance effect sensor with reduced noises in measurement to magnetic fields.

It is yet a further object of the present invention to provide a novel method of forming a magnetoresistance effect sensor free from the above problems.

It is a further more object of the present invention to provide a novel method of forming a magnetoresistance effect sensor with a high thermal stability.

It is still more object of the present invention to provide a novel method of forming a magnetoresistance effect sensor with reduced noises in measurement to magnetic fields.

It is moreover object of the present invention to provide a novel magnetic recording system utilizing a magnetoresistance effect sensor free from the above problems.

It is another object of the present invention to provide a novel magnetic recording system utilizing a magnetoresistance effect sensor with a high thermal stability.

It is still another object of the present invention to provide a novel magnetic recording system utilizing a magnetoresistance effect sensor with reduced noises in measurement to magnetic fields.

The present invention provides a multilayer structure comprising: one of a first antiferromagnetic layer and a bias ferromagnetic layer; an interface control layer in contact with the one of the first antiferromagnetic layer and the bias ferromagnetic layer; a free magnetic layer in contact with the interface control layer; a non-magnetic layer in contact with the free magnetic layer; a pinned magnetic layer in contact with the non-magnetic layer; and a second ferromagnetic layer in contact with the pinned magnetic layer, so that a magnetic anisotropy of the free magnetic layer is made directed to a parallel direction to interfaces of the multilayer structure due to an exchange coupling magnetic field of the one of the first antiferromagnetic layer and the bias ferromagnetic layer, and that a magnetic anisotropy of the pinned magnetic layer is made directed to a vertical direction to the interfaces of the multilayer structure due to an exchange coupling magnetic field of the second antiferromagnetic layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a multilayer structure comprising: one of a first antiferromagnetic layer and a bias ferromagnetic layer; an interface control layer in contact with the one of the first antiferromagnetic layer and the bias ferromagnetic layer; a free magnetic layer in contact with the interface control layer; a non-magnetic layer in contact with the free magnetic layer; a pinned magnetic layer in contact with the non-magnetic layer; and a second ferromagnetic layer in contact with the pinned magnetic layer.

It is preferable that a magnetic anisotropy of the free magnetic layer is made directed to a parallel direction to interfaces of the multilayer structure due to an exchange coupling magnetic field of the one of the first antiferromagnetic layer and the bias ferromagnetic layer, and that a magnetic anisotropy of the pinned magnetic layer is made directed to a vertical direction to the interfaces of the multilayer structure due to an exchange coupling magnetic field of the second antiferromagnetic layer.

It is also preferable that a first blocking temperature TB1 as a maximum temperature for generating an exchange coupling magnetic field of the first antiferromagnetic layer and a second blocking temperature TB2 as a maximum temperature for generating an exchange coupling magnetic field of second antiferromagnetic layer satisfy the following equations:

$$TB1 > 150° C. \text{ and } |TB2-TB1| > 50° C.$$

It is also preferable that a first exchange coupling magnetic field Hex1 of the one of the first antiferromagnetic layer and the bias ferromagnetic layer and a second exchange coupling magnetic field Hex2 of the second antiferromagnetic layer satisfy the following equations:

$$Hex1 > 10 \text{ Oe and } Hex2 > 200 \text{ Oe.}$$

It is also preferable that at least one of the first and second antiferromagnetic layers includes at least one of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

It is further preferable that at least one of the first and second antiferromagnetic layers includes an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

It is also preferable that at least one of the first and second antiferromagnetic layers has double layers, each of which includes at least one of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

It is further preferable that the each of the double layers includes an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

It is also preferable that the interface control layer includes at least one of Al, Ti, V, Cr, Mn, Cu, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Tb, Dy, Ho, Er, and oxides thereof, and alloys thereof.

It is further preferable that the interface control layer includes at least one of oxides of Fe, Ni and Co and double oxides thereof.

It is also preferable that a thickness "t" of the interface control layer satisfy the following equation: $1\text{ nm} \leq t \leq 10\text{ nm}$.

It is also preferable that at least one of the free magnetic layer and the pinned magnetic layer includes at least one of Co, Fe, Ni and alloys thereof.

It is also preferable that at least one of the free magnetic layer and the pinned magnetic layer has an interface layered region with the non-magnetic layer and the interface layered region comprises one of Co and Co—Fe.

The above novel multilayer structure of the first present invention is applicable to a magnetoresistaace effect element.

The magnetoresistance effect element having the above novel multilayer structure of the first present invention is also applicable to a magnetoresistance effect sensor comprising: a substrate; a bottom magnetic shield layer on the substrate; a bottom gap layer on the bottom magnetic shield layer; the above novel magnetoresistance effect element on the bottom gap layer; an electrode layer on a part of the magnetoresistance effect element; a top gap layer on both the electrode layer and the magnetoresistance effect element; and a top magnetic shield layer on the top gap layer.

It is preferable that the electrode layer is in contact with an edge of the magnetoresistance effect element.

It is also preferable that the electrode layer comprises first and second electrodes which are distanced from each other and provided on opposite side regions of the magnetoresistance effect element.

The above novel magnetoresistance effect sensor is also applicable to a magnetic recording system comprising: a magnetic recording medium having a plurality of tracks for recording data; a magnetic transducer having a magnetic detector of the above novel magnetoresistance effect sensor for detecting variation in magnetoresistance based upon a magnetic field generated from data stored in the magnetic recording medium; and an actuator mechanically connected to the magnetic transducer for moving the magnetic transducer over a surface of the magnetic recording medium.

A magnetic field is externally applied to the above magnetoresistance effect sensor in a track width direction parallel to interfaces of the multilayer structure of the magnetoresistance effect sensor, during which the magnetoresistance effect sensor is subjected to a heat treatment at a temperature of not less than a first blocking temperature TB1 of the first antiferromagnetic layer.

In order to realize a high power output and low noise property of the magnetoresistance effect sensor utilizing the spin valve phenomenon, it is important that the magnetic anisotropy of the free magnetic layer is directed in a track width direction or a parallel direction to interfaces of the multilayer structure due to an exchange coupling magnetic field of the one of the first antiferromagnetic layer and the bias ferromagnetic layer. It is also important that that a magnetic anisotropy of the pinned magnetic layer is made directed to a vertical direction to the interfaces of the multilayer structure due to an exchange coupling magnetic field of the second antiferromagnetic layer. The noises are co-related with the magnetic anisotropy of the free magnetic layer which shows variation in magnetization direction due to an externally applied magnetic field.

When the magnetic anisotropy of the free magnetic layer is directed to the vertical direction to the interfaces of the multilayer structure of the magnetoresistance effect element, the direction of the magnetic anisotropy is parallel to the direction of the externally applied magnetic field, whereby a movement of the magnetization direction is the magnetic domain movement mode which shows a hysteresis.

When the magnetic anisotropy of the free magnetic layer is directed to the parallel direction to the interfaces of the multilayer structure of the magnetoresistance effect element, the direction of the magnetic anisotropy is perpendicular to the direction of the externally applied magnetic field, whereby a movement of the magnetization direction is the magnetic domain rotation mode which shows no hysteresis.

The magnetic anisotropy of the free magnetic layer is an inductive magnetic anisotropy inductive by a magnetic field in the deposition of the free magnetic layer. This magnetic anisotropy of the free magnetic layer varies in direction by subjecting the free magnetic layer to a heat treatment at a temperature of at a temperature of not less than 200° C. which is necessary for causing an exchange-coupling magnetic field in the pinned magnetic layer during an external application of a magnetic field to the magnetoresistance effect element.

The pinned magnetic layer is subjected to the heat treatment in the magnetic field in the essential process for forming the magnetoresistance effect sensor utilizing the spin valve effect. This heat treatment in the magnetic field causes the magnetic anisotropy to be directed to the vertical direction to the interfaces of the multilayer structure of the magnetoresistance effect element. This magnetic anisotropy directed to the vertical direction causes noises to the magnetoresistance effect sensor. In order to cause the magnetic anisotropy of the free magnetic layer to be directed in perpendicular to the fixed magnetic anisotropy of the pinned magnetic layer without rotation of the magnetic anisotropy of the pinned magnetic layer, it is necessary to rotate the magnetic anisotropy of the free magnetic layer at a temperature lower by at least 50° C. than the temperature of the heat treatment to the pinned magnetic layer.

Contact of the entire surface of the antiferromagnetic layer or the large coercive ferromagnetic layer with the free magnetic layer enables effecting the free magnetic layer with a larger exchange coupling magnetic field than the inductive magnetic anisotropy. The sensitivity of the magnetoresistance effect sensor depends upon the magnitude of the exchange coupling magnetic field. The control in the magnitude of the exchange coupling magnetic field is extremely important. The insertion of the interface control layer comprising the thin non-magnetic metal layer between the antiferromagnetic layer and the ferromagnetic layer enables control of the magnitude of the exchange coupling magnetic field.

Accordingly, in accordance with the present invention, the novel multilayer structure of the magnetoresistance effect element comprises: one of a first antiferromagnetic layer and a bias ferromagnetic layer; an interface control layer in contact with the one of the first antiferromagnetic layer and the bias ferromagnetic layer; a free magnetic layer in contact with the interface control layer; a non-magnetic layer in contact with the free magnetic layer; a pinned magnetic layer in contact with the non-magnetic layer; and a second ferromagnetic layer in contact with the pinned magnetic layer, wherein a magnetic anisotropy of the free magnetic layer is made directed to a parallel direction to interfaces of the multilayer structure due to an exchange coupling magnetic field of the one of the first antiferromagnetic layer and the bias ferromagnetic layer, and that a magnetic anisotropy of the pinned magnetic layer is made directed to a vertical direction to the interfaces of the multilayer structure due to an exchange coupling magnetic field of the second antiferromagnetic layer.

The thickness "t" of the interface control layer satisfies the following equation: $1\text{ nm} \leq t \leq 10\text{ nm}$ so that the magnitude of the exchange coupling magnetic field is suitable for the magnetoresistance effect sensor.

If the bias ferromagnetic layer is used, a magnetic field larger than a coercive force of the bias ferromagnetic layer is applied in the track width direction parallel to the interfaces of the multilayer structure of the magnetoresistance effect, so that the magnetic anisotropy effected to the free magnetic layer is directed to the track width direction parallel to the interfaces of the multilayer structure of the magnetoresistance effect, whereby the variation of the magnetization direction is free from hysteresis.

The blocking temperature TB1 of the free magnetic layer is lowered by 50° C. Than the temperature of the heat treatment to the pinned magnetic layer with application of the magnetic field, so that the magnetic field is applied in the track width direction parallel to the interfaces of the multilayer structure of then magnetoresistance effect, whereby the anisotropic direction of the pinned magnetic layer is kept in the original direction whilst the anisotropic direction of the free magnetic layer is made directed in perpendicular to the anisotropic direction of the pinned magnetic layer.

The magnetic disk has an operational temperature of about 100° C., for which reason in order to obtain a performance stability of the magnetic disk, it is necessary that the first blocking temperature TB1 as a maximum temperature for generating an exchange coupling magnetic field of the first antiferromagnetic layer satisfies TB1>150° C. It is also necessary that the first exchange coupling magnetic field Hex1 of the one of the first antiferromagnetic layer is sufficiently larger than the inductive magnetic anisotropy of the free magnetic layer. It is preferable that Hex1>10 Oe.

Figure 2:
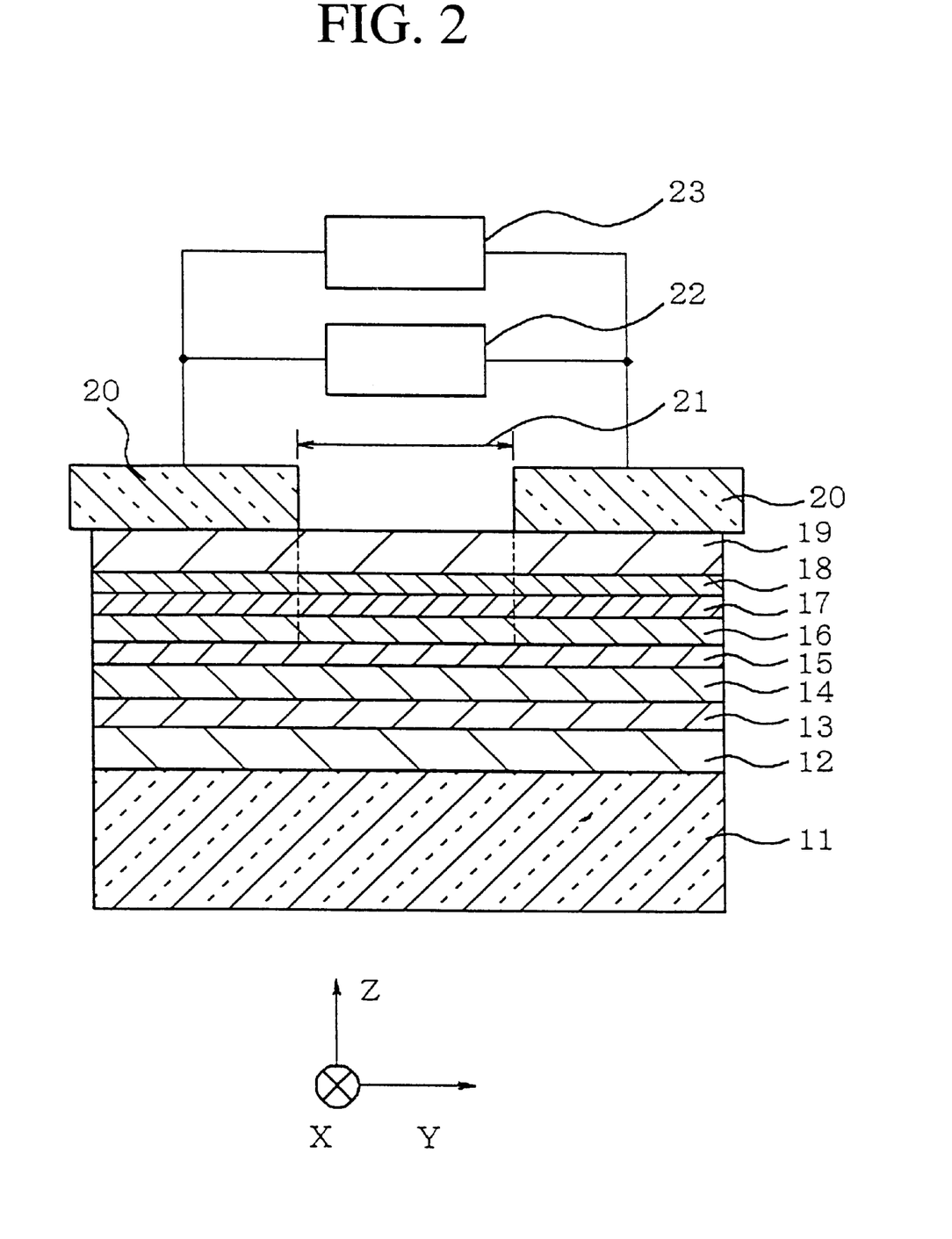
FIG. 2 is a fragmentary cross sectional elevation view illustrative of the above novel magnetoresistance effect sensor in accordance with the present invention, wherein an external magnetic field is applied in an X-direction to the novel magnetoresistance effect sensor.

FIG. 2 is a fragmentary cross sectional elevation view illustrative of the above novel magnetoresistance effect sensor in accordance with the present invention, wherein an external magnetic field is applied in an X-direction to the novel magnetoresistance effect sensor. The novel magnetoresistance effect sensor is formed on a substrate 11. A bottom gap layer 12 is provided on the substrate 11. A base layer 13 is provided on the bottom gap layer 12. A first antiferromagnetic layer 14 is provided on the base layer 13. An interface control layer 15 is provided on the first antiferromagnetic layer 14. A free magnetic layer 16 is provided on the interface control layer 15. A non-magnetic layer 17 is provided on the free magnetic layer 16. A pinned magnetic layer 18 is provided on the non-magnetic layer 17. A second antiferromagnetic layer 19 is provided on the pinned magnetic layer 18. Electrode layers 20 are provided on outside regions on the second ferromagnetic layer 19 so as to avoid a magnetic field detecting region 21 of the second ferromagnetic layer 19. A current source 22 is connected between the electrode layers 20. A detector 23 is also connected between the electrode layers 20.

Each of the first and second antiferromagnetic layers 14 and 19 comprises at least one of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy, or comprises an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy. Each of the first and second antiferromagnetic layers 14 and 19 may comprise double layers, each of which includes at least one of alpha-$Fe_2O_3$, NiO, Fe—Mn alloy, Ni—Mn alloy, Pt—Mn alloy, Ir—Mn alloy, Rh—Mu alloy, Ru—Mn alloy, and Cr—Al alloy. Each of the double layers may comprise an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

The interface control layer 15 comprises at least one of Al, Ti, V, Cr, Mn, Cu, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Tb, Dy, Ho, Er, and oxides thereof, and alloys thereof, or comprises at least one of oxides of Fe, Ni and Co and double oxides thereof.

Each of the free magnetic layer 16 and the pinned magnetic layer 18 comprises at least one of NiFe-based materials, NiFeCo-based materials, CoZr-based materials, NiFeB-based materials, Sendust, FeN-based materials and FeCo. Each of the free magnetic layer 16 and the pinned magnetic layer 18 as well as the non-magnetic layer 17 may be adjacent to a thin layer of one of Co and Co—Fe. The non-magnetic layer may comprise Au, Ag, Cu and alloys thereof.

The above novel magnetoresistance effect sensor is also applicable to a magnetic recording system comprising: a magnetic recording medium having a plurality of track for recording data; a magnetic transducer having a magnetic detector of the above novel magnetoresistance effect sensor for detecting variation in magnetoresistance based upon a magnetic field generated from data stored in the magnetic recording medium; and an actuator mechanically connected to the magnetic transducer for moving the magnetic transducer over a surface of the magnetic recording medium.

Figure 3:
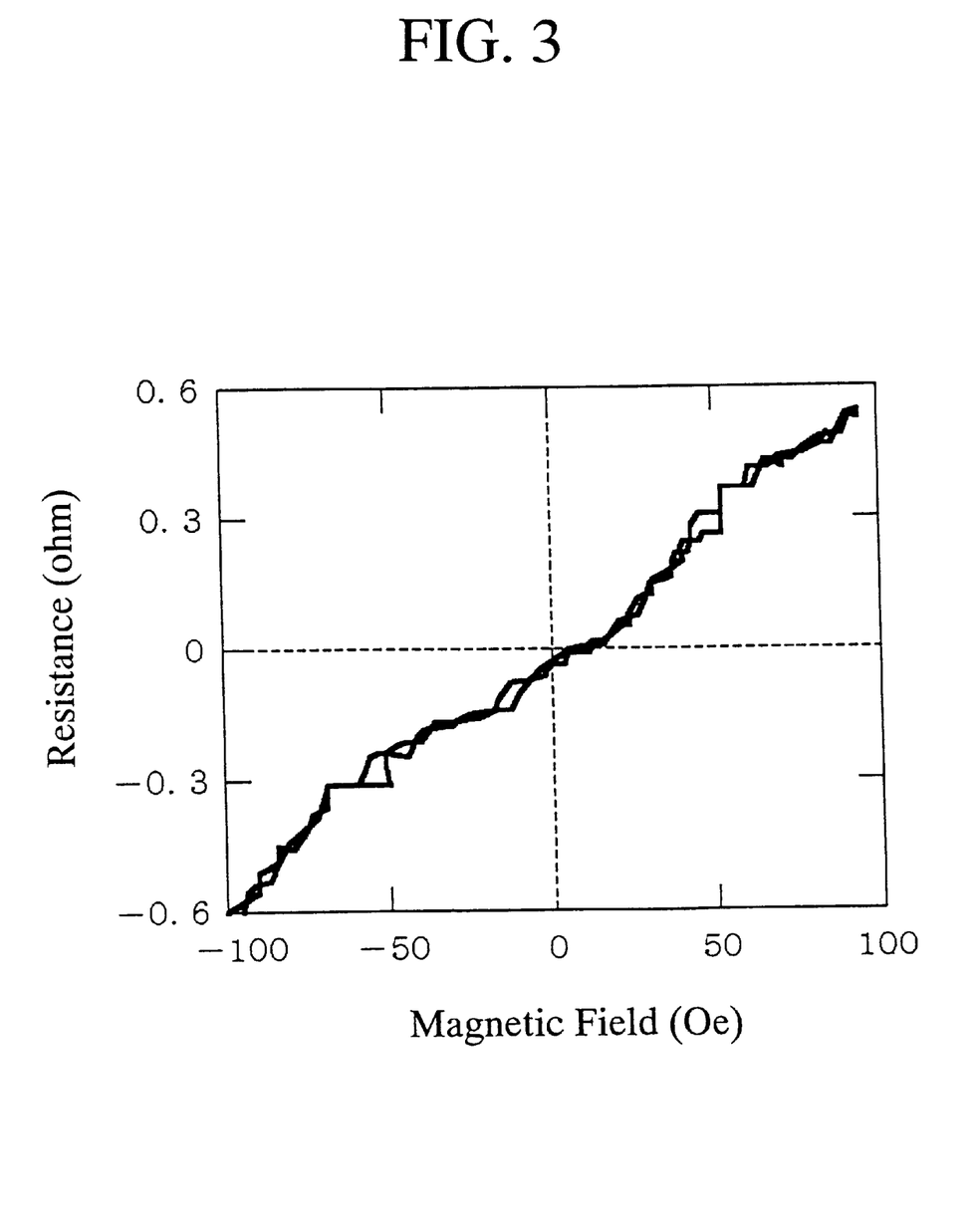
FIG. 3 is a diagram illustrative of an R-H curve of the magnetoresistance effect element utilizing the spin valve effect and comprising the first novel multilayer structure, wherein the first antiferromagnetic layer is made of NiO and has a thickness of 30 nanometers and the interface control layer is made of Cu and has a thickness of 1 nanometer.

FIG. 3 is a diagram illustrative of an R-H curve of the magnetoresistance effect element utilizing the spin valve effect and comprising the first novel multilayer structure, wherein the first antiferromagnetic layer is made of NiO and has a thickness of 30 nanometers and the interface control layer is made of Cu and has a thickness of 1 nanometer. Namely, the first antiferromagnetic layer is made of NiO and has a thickness of 30 nanometers. The interface control layer on the first antiferromagnetic layer is made of Cu and has a thickness of 1 nanometer. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoPc and has a thickness of 3 nanometers. The second antiferromagnetic layer on the pinned magnetic layer is made of NiMn and has a thickness of 30 nanometers.

The NiO first antiferromagnetic layer is deposited by a radio frequency sputtering method with use of a sintered target and an Ar sputtering gas under a gas pressure of 0.3 Pa with a power of 200 W. The Cu interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputtering method with use of an Ar sputtering gas under a gas pressure of 0.3 Pa with a power of 35 W. The NiMn second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a temperature of 200° C. with application of a magnetic field of 50 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis. If no polarizing process to the free magnetic layer is carried out, then the magnetoresistance element shows abnormal magnetoresistance curve or R-H curve with a remarkable hysteresis.

Figure 4:
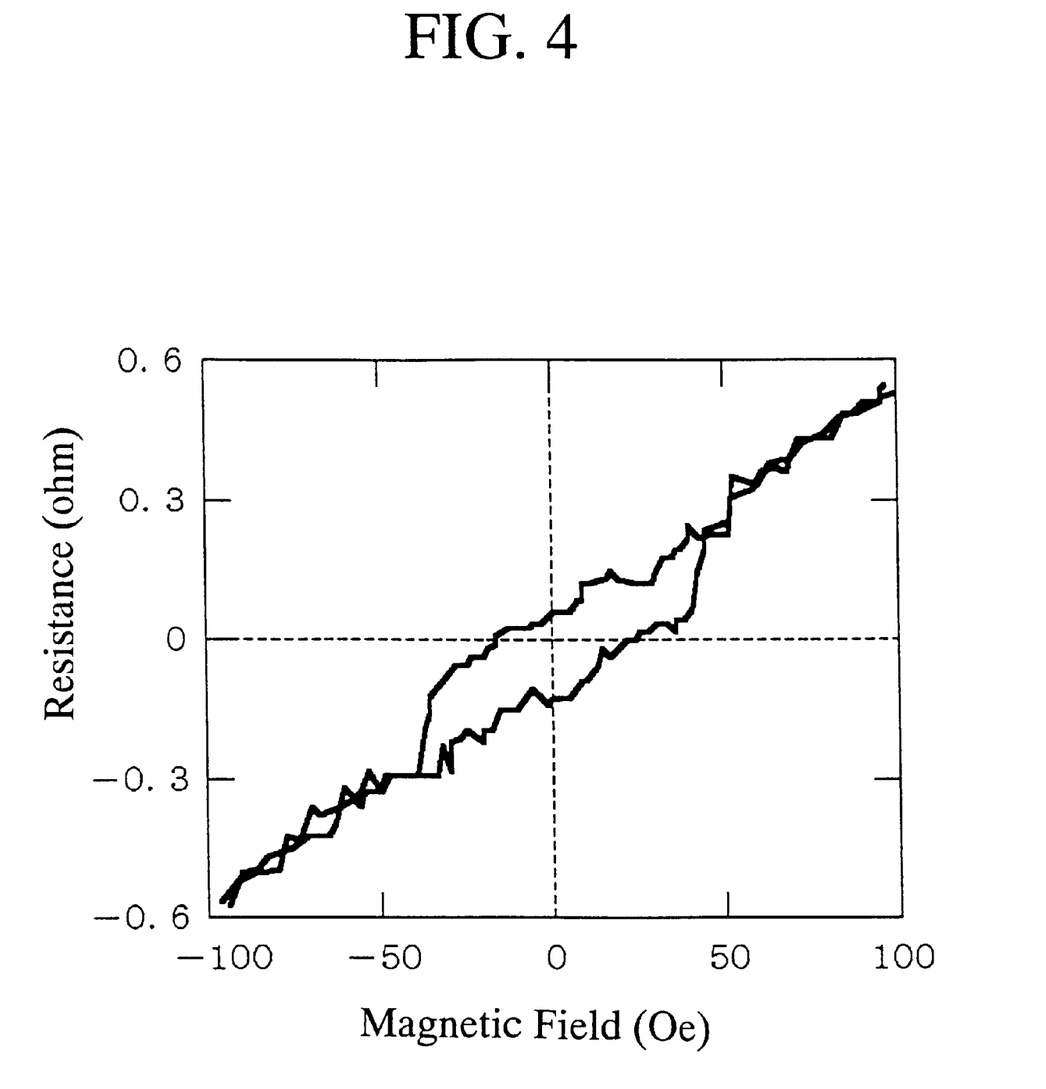
FIG. 4 is a diagram illustrative of an R-H curve of the magnetoresistance effect element utilizing the spin valve effect and having no first antiferromagnetic layer and also no interface control layer.

FIG. 4 is a diagram illustrative of an R-H curve of the magnetoresistance effect element utilizing the spin valve effect and having no first antiferromagnetic layer and also no interface control layer. This magnetoresistance element shows abnormal magnetoresistance curve or R—H curve with a remarkable hysteresis.

Figure 5:
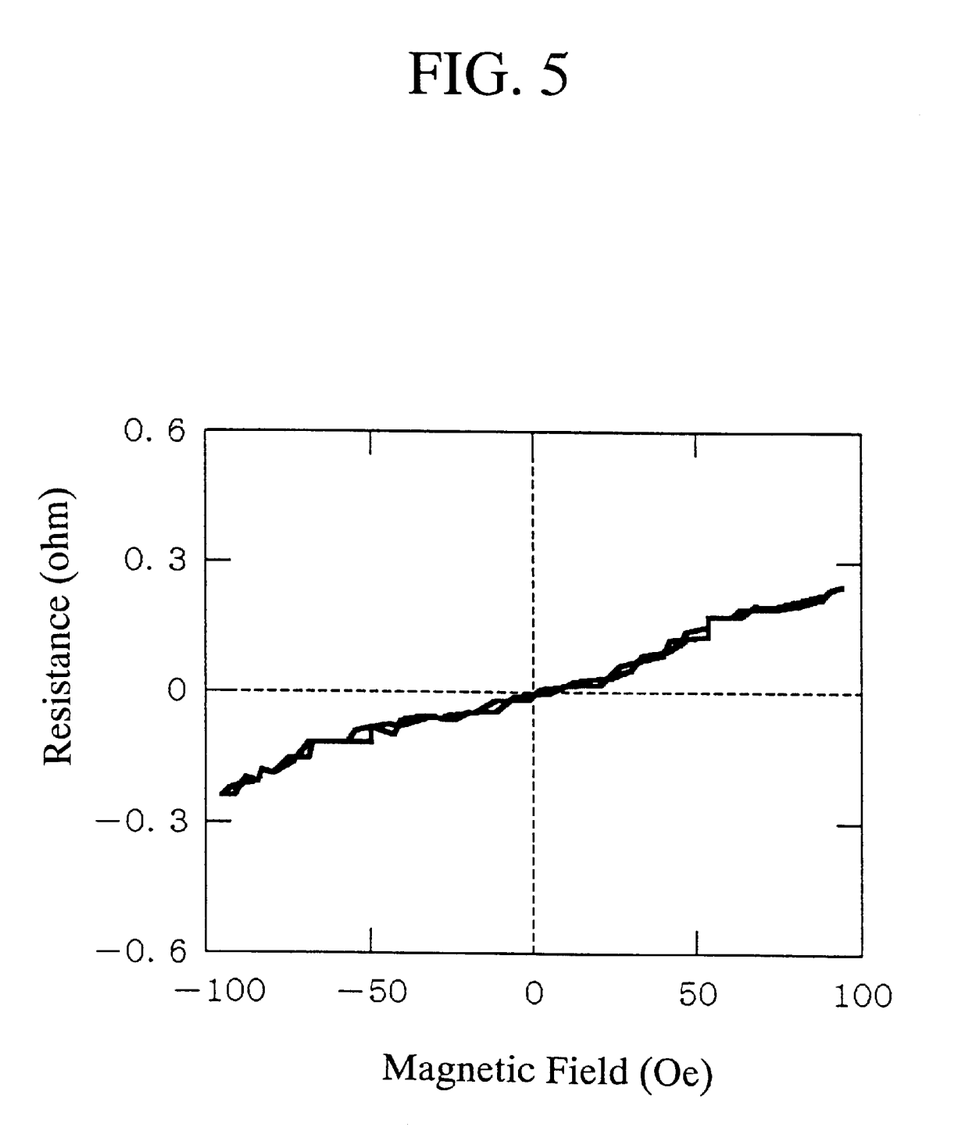
FIG. 5 is a diagram illustrative of an R-H curve of the magnetoresistance effect element utilizing the spin valve effect and having no interface control layer.

FIG. 5 is a diagram illustrative of an R-H curve of the magnetoresistance effect element utilizing the spin valve effect and having no interface control layer. This magnetoresistance element shows a normal magnetoresistance curve or R-H curve without any hysteresis. The exchange-coupling magnetic field is, however, large whereby the sensitivity is low and the output from the sensor is small.

Another magnetoresistance effect element is prepared, wherein the first antiferromagnetic layer is made of FcMu and has a thickness of 10 nanometers and the interface control layer is made of Ag and has a thickness of 1 nanometer. Namely, the first antiferromagnetic layer is made of FeMn and has a thickness of 10 nanometers. The interface control layer on the first antiferromagnetic layer is made of Ag and has a thickness of 1 nanometer. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoFe and has a thickness of 3 nanometers. The second antiferromagnetic layer on the pinned magnetic layer is made of NiNon and has a thickness of 30 nanometers.

The FeMn first antiferromagnetic layer is deposited by a radio frequency sputtering method with use of an alloy target and an Ar sputtering gas under a gas pressure of 0.3 Pa with a power of 100 W. The Ag interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputter method with use of an Ar sputtering gas under a gas pressure of 0.3 Pa with a power of 35 W. The NiMn second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a temperature of 150° C. with application of a magnetic field of 50 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis.

Still another magnetoresistance effect element is prepared, wherein the fist antiferromagnetic layer is made of alpha-$Fe_2O_3$ and has a thickness of 30 nanometers and the interface control layer is made of Pb and has a thickness of 2 nanometers. Namely, the first antiferromagnetic layer is made of alpha-$Fe_2O_3$ and has a thickness of 30 nanometers. The interface control layer on the first antiferromagnetic layer is made of Pb and has a thickness of 2 nanometers. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoFe and has a thickness of 3 nanometers. The second antiferromagnetic layer on the pinned magnetic layer is made of NiMn and has a thickness of 30 nanometers.

The alpha-$Fe_2O_3$ first antiferromagnetic layer is deposited by a radio frequency sputtering method with use of a sintered target and an Ar sputtering gas under a gas pressure of 0.3 Pa with a power of 200 W. The Pb interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputtering method with use of an Ar sputtering gas under a gas pressure of 0.3 Pa with a power of 35 W. The NiMn second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a temperature of 180° C. with application of a magnetic field of 50 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis.

Yet another magnetoresistance effect element is prepared, wherein the first antiferromagnetic layer is made of Cr—Al and has a thickness of 30 nanometers and the interface control layer is made of $CrO_2$ and has a thickness of 2 nanometers. Namely, the first antiferromagnetic layer is made of Cr—Al and has a thickness of 30 nanometers. The interface control layer on the first antiferromagnetic layer is made of $CrO_2$ and has a thickness of 3 nanometers. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoFe and has a thickness of 3 nanometers. The second antiferromagnetic layer on the pinned magnetic layer is made of NiMn and has a thickness of 30 nanometers.

The Cr—Al first antiferromagnetic layer is deposited by a radio frequency sputtering method with use of an alloy target and an Ar sputtering gas under a gas pressure of 0.3 Pa with a power of 100 W. The $CrO_2$ interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputtering method with use of an Ar sputtering gas under a gas pressure of 0.3 Pa with a power of 35 W. The NiMn second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a temperature of 220° C. with application of a magnetic field of 50 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis.

Further another magnetoresistance effect element is prepared, wherein the bias ferromagnetic layer is made of CoPt and has a thickness of 10 nanometers and the interface control layer is made of CoO and has a thickness of 2 nanometers. Namely, the bias ferromagnetic layer is made of CoPt and has a thickness of 10 nanometers. The interface control layer on the bias ferromagnetic layer is made of CoO and has a thickness of 2 nanometers. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoFe and has a thickness of 3 nanometers. The second antiferromagnetic layer on the pinned magnetic layer is made of NiMn and has a thickness of 30 nanometers.

The CoPt bias ferromagnetic layer is deposited by a DC magnetron sputtering method with use of an alloy target and an Ar sputtering gas under a gas pressure of 0.3 Pa with a power of 100 W. The CoO interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputtering method with use of an Ar sputtering gas under a gas pressure of 0.3 Pa with a power of 35 W. The NiMn second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a room temperature with application of a magnetic field of 5 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis Further another magnetoresistance effect element is prepared, wherein the bias ferromagnetic layer is made of CoCrPt and has a thickness of 10 nanometers and the interface control layer is made of Au and has a thickness of 1 nanometer Namely, the bias ferromagnetic layer is made of CoCrPt and has a thickness of 10 nanometers. The interface control layer on the bias ferromagnetic layer is made of Au and has a thickness of 1 nanometer. The free magnetic layer on the interface control layer is made of NiFe and has a thickness of 8 nanometers. The non-magnetic layer on the free magnetic layer is made of Cu and has a thickness of 2.5 nanometers. The pinned magnetic layer on the non-magnetic layer is made of CoFe and has a thickness of 3 nanometers. The second antiferromagnetic layer on the pinned magnetic layer is made of NiMn and has a thickness of 30 nanometers.

The CoCrPt bias ferromagnetic layer is deposited by a DC magnetron sputtering method with use of an alloy target and an Ar sputtering gas under a gas pressure of 0.3 Pa with a power of 100 W. The Au interface control layer and the Cu non-magnetic layer are deposited by a DC magnetron sputtering method with use of an Ar sputtering gas under a gas pressure of 0.3 Pa with a power of 7 W. The NiFe non-magnetic layer and the CoFe pinned magnetic layer are also deposited by a DC magnetron sputtering method with use of an At sputtering gas under a gas pressure of 0.3 Pa with a power of 35 W. The NiMa second antiferromagnetic layer is deposited by a radio frequency sputtering method with use of an alloy target and an Ar sputtering gas under a gas pressure of 0.3 Pa with a power of 100 W.

The prepared multilayer structure is first subjected to a polarizing process to the pinned magnetic layer, for example, a heat treatment at a temperature of 270° C. with application of a magnetic field of 3 kOe in the vertical direction to the interfaces of the multilayer structure for 5 hours. Subsequently, the multilayer structure is then subjected to another polarizing process to the free magnetic layer, for example, a heat treatment at a room temperature with application of a magnetic field of 3 kOe in the parallel direction to the interfaces of the multilayer structure for 1 minute. The multilayer structure is then shaped to a size of 1 micrometer by 1 micrometer. Metal electrodes are provided thereon.

This magnetoresistance element shows a normal magnetoresistance curve or R-H curve free of any hysteresis Whereas modifications of the present invention will be apparent to a person having ordinary skin in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multilayer structure comprising:
   one of a first antiferromagnetic layer and a bias ferromagnetic layer;
   an interface control layer in contact with and disposed directly above said one of said first antiferromagnetic layer and said bias ferromagnetic layer;
   a free magnetic layer in contact with and disposed directly above said interface control layer;
   a non-magnetic layer in contact with and disposed directly above said free magnetic layer;
   a pinned magnetic layer in contact with and disposed directly above said non-magnetic layer; and a second ferromagnetic layer in contact with and disposed directly above said pinned magnetic layer.

2. A multilayer structure comprising:

one of a first antiferromagnetic layer and a bias ferromagnetic layer;

an interface control layer in contact with said one of said first antiferromagnetic layer and said bias ferromagnetic layer;

a free magnetic layer in contact with said interface control layer;

a non-magnetic layer in contact with said free magnetic layer;

a pinned magnetic layer in contact with said non-magnetic layer; and a second ferromagnetic layer in contact with said pinned magnetic layer, wherein a magnetic anisotropy of said free magnetic layer is directed to a parallel direction to interfaces of said multilayer structure due to an exchange coupling magnetic field of said one of said first antiferromagnetic layer and said bias ferromagnetic layer, and wherein a magnetic anisotropy of said pinned magnetic layer is directed to a vertical direction to said interfaces of said multilayer structure due to an exchange coupling magnetic field of said second antiferromagnetic layer.

3. A multilayer structure comprising:

one of a first antiferromagnetic layer and a bias ferromagnetic layer;

an interface control layer in contact with said one of said first antiferromagnetic layer and said bias ferromagnetic layer;

a free magnetic layer in contact with said interface control layer;

a non-magnetic layer in contact with said free magnetic layer;

a pinned magnetic layer in contact with said non-magnetic layer; and a second ferromagnetic layer in contact with said pinned magnetic layer, wherein a first blocking temperature TB1 as a maximum temperature for generating an exchange coupling magnetic field of said first antiferromagnetic layer and a second blocking temperature TB2 as a maximum temperature for generating an exchanged coupling magnetic field of said second antiferromagnetic layer satisfy the following equations:

$TB1 > 150° C.$ and $|TB2 - TB1| > 50° C.$

4. A multilayer structure comprising:

one of a first antiferromagnetic layer and a bias ferromagnetic layer;

an interface control layer in contact with said one of said first antiferromagnetic layer and said bias ferromagnetic layer;

a free magnetic layer in contact with said interface control layer;

a non-magnetic layer in contact with said free magnetic layer;

a pinned magnetic layer in contact with said non-magnetic layer; and a second ferromagnetic layer in contact with said pinned magnetic layer, wherein a first exchange coupling magnetic field Hex1 of said one of said first antiferromagnetic layer and said bias ferromagnetic layer and a second exchange coupling magnetic field Hex2 of said second antiferromagnetic layer satisfy the following equations:

$Hex1 > 10\ Oe$ and $Hex2 > 200\ Oe.$

5. A multilayer structure comprising:

one of a first antiferromagnetic layer and a bias ferromagnetic layer;

an interface control layer in contact with said one of said first antiferromagnetic layer and said bias ferromagnetic layer;

a free magnetic layer in contact with said interface control layer;

a non-magnetic layer in contact with said free magnetic layer;

a pinned magnetic layer in contact with said non-magnetic layer; and a second ferromagnetic layer in contact with said pinned magnetic layers, wherein at least one of said first and second antiferromagnetic layers includes at least one of alpha-$Fe_2O_3$, $NiO_3$, Fe—Mn alloy, Ni—Mn alloy, Pt—Mn alloy, Ir—Mn alloy, Rh—Mn alloy, Ru—Mn alloy, and Cr—Al alloy.

6. The multilayer structure as claimed in claim 5, wherein at least one of said first and second antiferromagnetic layers includes an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloys and Cr—Al alloy.

7. The multilayer structure as claimed in claim 5, wherein at least one of said first and second antiferromagnetic layers has double layers, each of which includes at least one of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

8. The multilayer structure as claimed in claim 7, wherein said each of said double layers includes an alloy of at least two of alpha-$Fe_2O_3$, NiO, Fe—Mn alloy, Ni—Mn alloy, Pt—Mn alloy, Ir—Mn alloy, Rh—Mn alloy, Ru—Mn alloy, and Cr—Al alloy.

9. A multilayer structure comprising:

one of a first antiferromagnetic layer and a bias ferromagnetic layer;

an interface control layer in contact with said one of said first antiferromagnetic layer and said bias ferromagnetic layer;

a free magnetic layer in contact with said interface control layer;

a non-magnetic layer in contact with said free magnetic layer;

a pinned magnetic layer in contact with said non-magnetic layer; and a second ferromagnetic layer in contact with said pinned magnetic layer, wherein said interface control layer includes at least one of Al, Ti, Cr, Mn, Cu, Zn, Y, Zr, Nb, Mo, Ru, Rh, Pd, Ag, Hf, Ta, W, Re, Pt, Au, Pb, Bi, La, Ce, Pr, Nd, Sm, Eu, Gd, Th, Dy, Ho, Er, and oxides thereof, and alloys thereof.

10. The multilayer structure as claimed in claim 1, wherein said interface control layer includes at least one of oxides of Fe, Ni and Co and double oxides thereof.

11. The multilayer structure as claimed in claim 1, wherein a thickness "t" of the interface control layer satisfy the following equation:

$$1 \text{ nm} \leq t \leq 10 \text{ nm}.$$

12. The multilayer structure as claimed in claim 1, wherein at least one of said free magnetic layer and said pinned magnetic layer includes at least one of Co, Fe, Ni and alloys thereof.

13. The multilayer structure as claimed in claim 1, wherein at least one of said free magnetic layer and said pinned magnetic layer has an interface layered region with said non-magnetic layer and said interface layered region comprises one of Co and Co—Fe.

14. A magnetoresistance effect element having a multilayer structure that comprises:

one of a first antiferromagnetic layer and a bias ferromagnetic layer;

an interface control layer in contact with and disposed directly above said one of said first antiferromagnetic layer and said bias ferromagnetic layer;

a free magnetic layer in contact with and disposed directly above said interface control layer;

a non-magnetic layer in contact with and disposed directly above said free magnetic layer;

a pinned magnetic layer in contact with and disposed directly above said non-magnetic layer; and a second ferromagnetic layer in contact with and disposed directly above said pinned magnetic layer.

* * * * *